(12) United States Patent
Kim

(10) Patent No.: US 6,366,148 B1
(45) Date of Patent: Apr. 2, 2002

(54) DELAY LOCKED LOOP CIRCUIT AND METHOD FOR GENERATING INTERNAL CLOCK SIGNAL

(75) Inventor: Kyu-hyoun Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/713,968

(22) Filed: Nov. 16, 2000

(30) Foreign Application Priority Data

Nov. 29, 1999 (KR) ............................................ 99-53468

(51) Int. Cl.$^7$ .............................................. H03H 11/26
(52) U.S. Cl. ......................... 327/262; 327/254; 327/355
(58) Field of Search ................................ 327/261, 262, 327/254, 341, 147, 153, 156, 161, 163, 355

(56) References Cited

U.S. PATENT DOCUMENTS

| | | | |
|---|---|---|---|
| 4,220,923 A | * | 9/1980 | Pelchat et al. ............... 455/295 |
| 5,216,698 A | * | 6/1993 | Boulanger et al. .......... 375/376 |
| 5,432,480 A | * | 7/1995 | Popescu ....................... 331/11 |
| 5,787,124 A | * | 7/1998 | Shimura ....................... 375/328 |
| 6,208,181 B1 | * | 3/2001 | Johnson ....................... 327/156 |

FOREIGN PATENT DOCUMENTS

KR 9516018 6/1995

* cited by examiner

Primary Examiner—Toan Tran
Assistant Examiner—Cassandra Cox
(74) Attorney, Agent, or Firm—F. Chau & Associates, LLP

(57) ABSTRACT

A delay locked loop circuit prevents occurrence of jitter and has a small chip area when it is realized as a semiconductor integrated circuit. The delay locked loop circuit includes a phase shifter, a compensation delay unit, a component coefficient extractor, a phase inverter, first and second component signal generators, and a phase mixer. In this structure, the delay locked loop circuit generates an output clock signal, the phase of which leads that of an externally-applied input clock signal by a predetermined delay time to compensate for a delay time which inevitably occurs in semiconductor integrated circuits. The phase shifter generates a first clock signal in phase with the input clock signal and a second clock signal having a 90° phase difference with respect to the first clock signal. The compensation delay unit outputs a third clock signal, the phase of which lags that of the input clock signal by a predetermined delay time. The component coefficient extractor extracts first and second component coefficients of the third clock signal. The phase inverter inverts the phase of the second component coefficient. The first component signal generator generates a first component signal by multiplying the first component coefficient by the first clock signal. The second component signal generator generates a second component signal by multiplying the inverted second component coefficient by the second clock signal. The phase mixer mixes the first and second component signals to generate the output clock signal.

20 Claims, 8 Drawing Sheets

DELAY LOCKED LOOP CIRCUIT AND METHOD FOR GENERATING INTERNAL CLOCK SIGNAL

BACKGROUND OF THE INVENTION

1. Field of the Invention

The present invention relates to semiconductor devices, and more particularly, to a delay locked loop circuit for generating an internal clock signal to be used for integrated circuits in semiconductor devices.

2. Description of the Related Art

Delay locked loop (DLL) circuits are used to provide an internal clock signal whose phase is advanced by a predetermined time period ahead of a reference clock signal. Generally, an internal clock signal having a known phase relationship to an external reference clock is required to synchronize semiconductor integrated circuits having a relatively high integration density, such as a Rambus DRAM (RDRAM) and a synchronous DRAM (SDRAM).

Specifically, an external clock reference signal received via an input pin of an integrated circuit device is applied to a clock buffer to generate an internal clock signal. The internal clock signal in turn controls a data output buffer to output data from the integrated circuit device. In this process of outputting data, the internal clock signal is delayed for a certain time period with respect to the external clock signal, and the output of data from the data output buffer is also delayed for a certain time period with respect to the internal clock signal.

Thus, the output of data from the data output buffer is delayed for a longer time period with respect to the external clock signal. In other words, a time period from the input of an external clock signal to the output of data from the output data buffer, which is an output data access time tAC, is lengthened.

To solve such delay problems, there have been provided delay locked loop circuits designed to make the phase of an internal clock signal lead by a predetermined time period, so that data can be output without delay from an external clock signal. That is, in a conventional delay locked loop circuit, when receiving an external clock signal and generating an internal clock signal, the phase of the internal clock signal leads that of the external clock signal by a predetermined time period. Then, the internal clock signal is used as a clock signal for each unit such as a data output buffer.

FIG. 1 is a block diagram of a conventional delay locked loop circuit. A conventional delay locked loop circuit typically includes a phase detector 11, a charge pump 13, a voltage controlled delay line (VCDL) 15 and a compensation delay 17.

In the conventional delay locked loop circuit, a variation width of delay time of the VCDL 15 must be increased to widen an operational frequency band. This is achieved by increasing the variation width of delay time of each unit delay means constituting the VCDL 15 or by separately installing a coarse VCDL and a fine VCDL. However, in the former method to increase the variation width of delay time, variation in the entire delay time with respect to noises of the output of the charge pump 13, that is, a control voltage Vcon, increases. As a result, jitter may occur in operation signals. In the latter method, jitter may occur as much as corresponding to a coarse unit delay time at the moment that delay time value of the coarse VCDL changes.

To solve the problems in such conventional delay locked loop circuits, delay locked loop circuits using phase interpolation techniques as shown in FIG. 2 have been developed. Referring to FIG. 2, a conventional delay locked loop circuit using the phase interpolation techniques includes a phase detector 21, a charge pump 22, a phase interpolator 23, a compensation delay unit 24, a phase splitter 25, a phase selector 26 and a control circuit 27.

While such conventional delay locked loop circuits using the phase interpolation techniques can prevent occurrence of jitter, size of a chip using such a delay locked loop circuit increases, when it is realized as a semiconductor integrated circuit, due to the phase detector 25, the phase selector 26 and the control circuit 27 necessary to prevent jitter.

Therefore, a need exists for a delay locked loop circuit which prevents the occurrence of jitter and requires a small area when being fabricated as an integrated circuit in a semiconductor device.

SUMMARY OF THE INVENTION

An object of the present invention is to provide a delay locked loop circuit which can prevent occurrence of jitter and has a small area when it is realized as a semiconductor integrated circuit.

Another object of the present invention is to provide a method of generating an internal clock signal to be used for integrated circuits in semiconductor devices, where the method prevents occurrence of jitter in the integrated circuits.

According to an aspect of the present invention to achieve the first object, there is provided a delay locked loop circuit for receiving an input clock signal (i.e., an external clock signal) and generating an output clock signal (i.e., an internal clock signal), the phase of which leads that of the input clock signal by a predetermined time. The delay locked loop circuit includes a phase shifter for generating a first clock signal in phase with the input clock signal and a second clock signal having a 90° phase difference with respect to the first clock signal; a compensation delay unit for outputting a third clock signal, the phase of which lags that of the input clock signal by the predetermined time; a component coefficient extractor for extracting a first component coefficient of the third clock signal with respect to the first clock signal and a second component coefficient of the third clock signal with respect to the second clock signal; a phase inverter for inverting the phase of the second component coefficient; a first component signal generator for generating a first component signal by multiplying the first component coefficient by the first clock signal; a second component signal generator for generating a second component signal by multiplying the inverted second component coefficient by the second clock signal; and a phase mixer for mixing the first and second component signals to generate the output clock signal.

According to another aspect of the present invention to achieve the first object, there is provided a delay locked loop circuit for receiving an input clock signal and generating an output clock signal, the phase of which leads that of the input clock signal by a predetermined time. The delay locked loop circuit includes a phase shifter for generating a first clock signal in phase with the input clock signal and a second clock signal having a 90° phase difference with respect to the first clock signal; a compensation delay unit for outputting a third clock signal, the phase of which lags that of the input clock signal by the predetermined time; a component coefficient extractor for extracting a first component coefficient of the third clock signal with respect to the first clock signal and a second component coefficient of the third clock signal with respect to the second clock signal; a phase inverter for inverting the phase of the second clock signal; a first component signal generator for generating a first component signal by multiplying the first component coefficient by the first clock signal; a second component signal generator for generating a second component signal by multiplying the second component coefficient by the inverted second clock signal; and a phase mixer for mixing the first and second component signals to generate the output clock signal.

Preferably, the component coefficient extractor includes: a first multiplier for multiplying the first clock signal by the third clock signal; a second multiplier for multiplying the second clock signal by the third clock signal; a first low pass filter for low-pass filtering the output signal of the first multiplier to output the first component coefficient; and a second low pass filter for low-pass filtering the output signal of the second multiplier to output the second component coefficient.

Alternatively, the component coefficient extractor can includes: a phase detector for receiving the third clock signal and the output clock signal and detecting the phase difference between the two signals; a first charge pump for outputting the first component coefficient; and a second charge pump for outputting the second component coefficient. In this case, the component coefficient extractor may further include a first voltage sensor for sensing the voltage level of the first component coefficient; a second voltage sensor for sensing the voltage level of the second component coefficient; a first exclusive OR gate for performing exclusive OR with respect to the output signal of the phase detector and the output signal of the second voltage sensor to output a signal for controlling the first charge pump; and a second exclusive OR gate for performing exclusive OR with respect to the output signal of the phase detector and the output signal of the first voltage sensor to output a signal for controlling the second charge pump, such that the first component coefficient increases when the second component coefficient decreases and the first component coefficient decreases when the second component coefficient increases.

According to an aspect of the present invention to achieve the second object, there is provided a method of generating an internal clock signal, the phase of which leads that of an external clock signal by a predetermined time. The method of the present invention includes generating a first clock signal in phase with the external clock signal and a second clock signal having a 90° phase difference with respect to the first clock signal; generating a third clock signal, the phase of which lags that of the external clock signal by the predetermined time; extracting a first component coefficient of the third clock signal with respect to the first clock signal and a second component coefficient of the third clock signal with respect to the second clock signal; inverting the phase of the second component coefficient; multiplying the first component coefficient by the first clock signal; multiplying the inverted second component coefficient by the second clock signal; and mixing two products of the above multiplications to generate the internal clock signal.

According to another aspect of the present invention to achieve the second object, there is provided a method of generating an internal clock signal, the phase of which leads that of an external clock signal by a predetermined time. The method of the present invention includes generating a first clock signal in phase with the external clock signal and a second clock signal having a 90° phase difference with respect to the first clock signal; generating a third clock signal, the phase of which lags that of the external clock signal by the predetermined time; extracting a first component coefficient of the third clock signal with respect to the first clock signal and a second component coefficient of the third clock signal with respect to the second clock signal; inverting the phase of the second clock signal; multiplying the first component coefficient by the first clock signal; multiplying the second component coefficient by the second clock signal inverted; and mixing two products of the above multiplications to generate the internal clock signal.

Preferably, the step of extracting the component coefficients includes: multiplying the first clock signal by the third clock signal; multiplying the second clock signal by the third clock signal; low-pass filtering the product of the first clock signal by the third clock signal to generate the first component coefficient; and low-pass filtering the product of the second clock signal by the third clock signal to generate the second component coefficient.

Alternatively, the step of extracting the component coefficients can includes: detecting the phase difference between the third clock signal and the internal clock signal to generate a control signal corresponding to the detected phase difference; outputting the first component coefficient by charge-pumping a first signal which is controlled by the control signal and the second component coefficient; and outputting the second component coefficient by charge-pumping a second signal which is controlled by the control signal and the first component coefficient. In this case, the step of extracting the component coefficients may further include sensing the voltage level of the first component coefficient to generate a first sensing signal; sensing the voltage level of the second component coefficient to generate a second sensing signal; performing exclusive OR with respect to the control signal and the second sensing signal to generate the first signal; and performing exclusive OR with respect to the control signal and the first sensing signal to generate the second signal, such that the first component coefficient increases when the second component coefficient decreases and the first component coefficient decreases when the second component coefficient increases.

BRIEF DESCRIPTION OF THE DRAWINGS

The above and other objects and advantages of the present invention will become more apparent by describing in detail preferred embodiments thereof with reference to the attached drawings in which.

DESCRIPTION OF THE PREFERRED EMBODIMENTS

Figure 1:
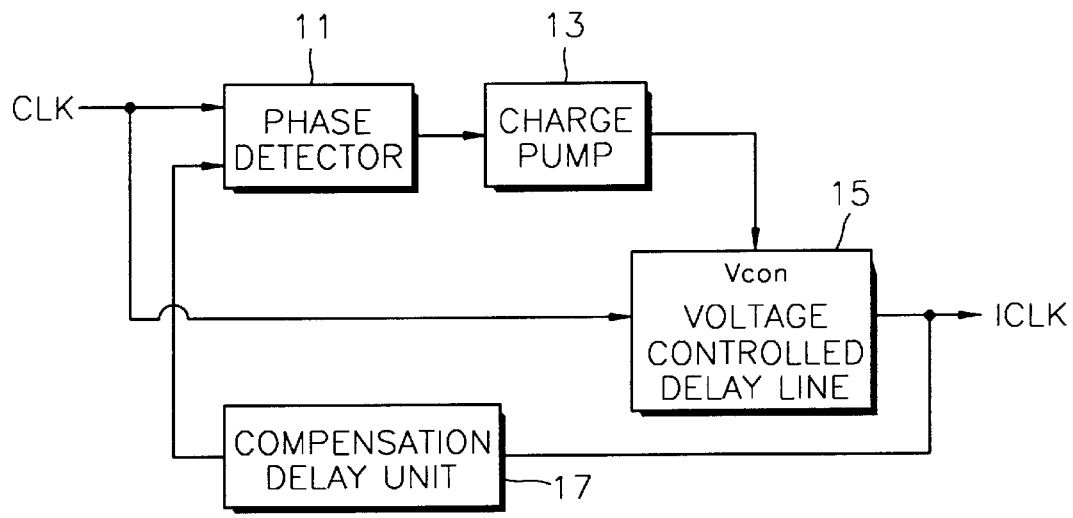
FIG. 1 is a block diagram of a conventional delay locked loop circuit.

Attached drawings for illustrating a preferred embodiment of the present invention, and the contents written on the attached drawings should be referred to for a sufficient understanding of the merits of the present invention and the operation thereof and the objectives accomplished by the operation of the present invention.

Hereinafter, the present invention will be described in detail by explaining preferred embodiments of the present invention with reference to the attached drawings. Like reference numerals in the drawings denote the same members.

Figure 3:
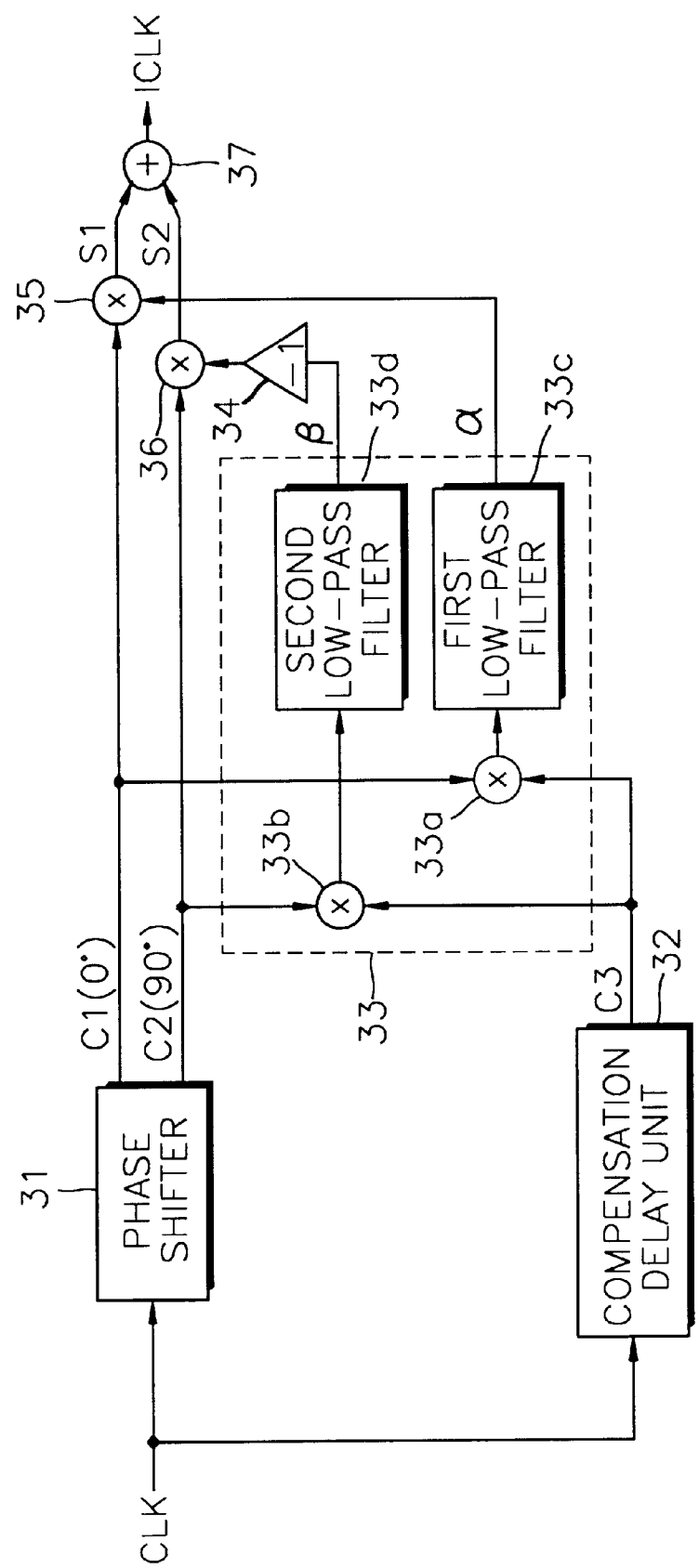
FIG. 3 is a block diagram of a delay locked loop circuit according to a first embodiment of the present invention.

Referring to FIG. 3, a delay locked loop circuit according to a first embodiment of the present invention includes a phase shifter 31, a compensation delay unit 32, a component coefficient extractor 33, a phase inverter 34, a first component signal generator 35, a second component signal generator 36 and a phase mixer 37. The delay locked loop circuit according to the first embodiment is a type of an open loop delay locked loop circuit.

The phase shifter 31 receives an external clock signal CLK as input, and generates a first clock signal C1, the phase of which is the same as that of the input clock signal CLK, and a second clock signal C2 having a 90° phase difference with respect to the first clock signal C1. The compensation delay unit 32 receives the input clock signal CLK and outputs a third clock signal C3 the phase of which lags that of the input clock signal CLK by a predetermined time Td. The predetermined time Td corresponds to a delay time to be compensated for, which occurs inevitably in a semiconductor integrated circuit.

The component coefficient extractor 33 extracts a first component coefficient ($\alpha$) of the third clock signal C3 with respect to the first clock signal C1 and a second component coefficient ($\beta$) of the third clock signal C3 with respect to the second clock signal C2. The component coefficient extractor 33 preferably includes first and second multipliers 33a and 33b and first and second low-pass filters 33c and 33d. The first multiplier 33a multiplies the first clock signal C1 by the third clock signal C3, and the first low pass filter 33c low pass filters the output signal of the first multiplier 33a to output the first component coefficient ($\alpha$). The second multiplier 33b multiplies the second clock signal C2 by the third clock signal C3, and the second low pass filter 33d low pass filters the output signal of the second multiplier 33b to output the second component coefficient ($\beta$).

The phase inverter 34 inverts the phase of the second component coefficient ($\beta$). The first component signal generator 35 having a multiplier multiplies the first component coefficient ($\alpha$) by the first clock signal C1 to generate a first component signal S1. The second component signal generator 36 multiplies a second inverted component coefficient ($-\beta$) by the second clock signal C2 to generate a second component signal S2. The phase mixer 37 having a mixer mixes the first and second component signals S1 and S2 to generate an output clock signal ICLK whose phase is advanced by a predetermined time period ahead of the input clock signal CLK. The output clock signal ICLK can be used as a preferred internal clock signal of a semiconductor integrated circuit such as RDRAM, SDRAM, or the like.

The phase shifter 31, the compensation delay unit 32, and the first and second low pass filters 33c and 33d commonly available and their operations are readily apparent to those skilled in the art, so they will not be described in detail.

Figure 4:
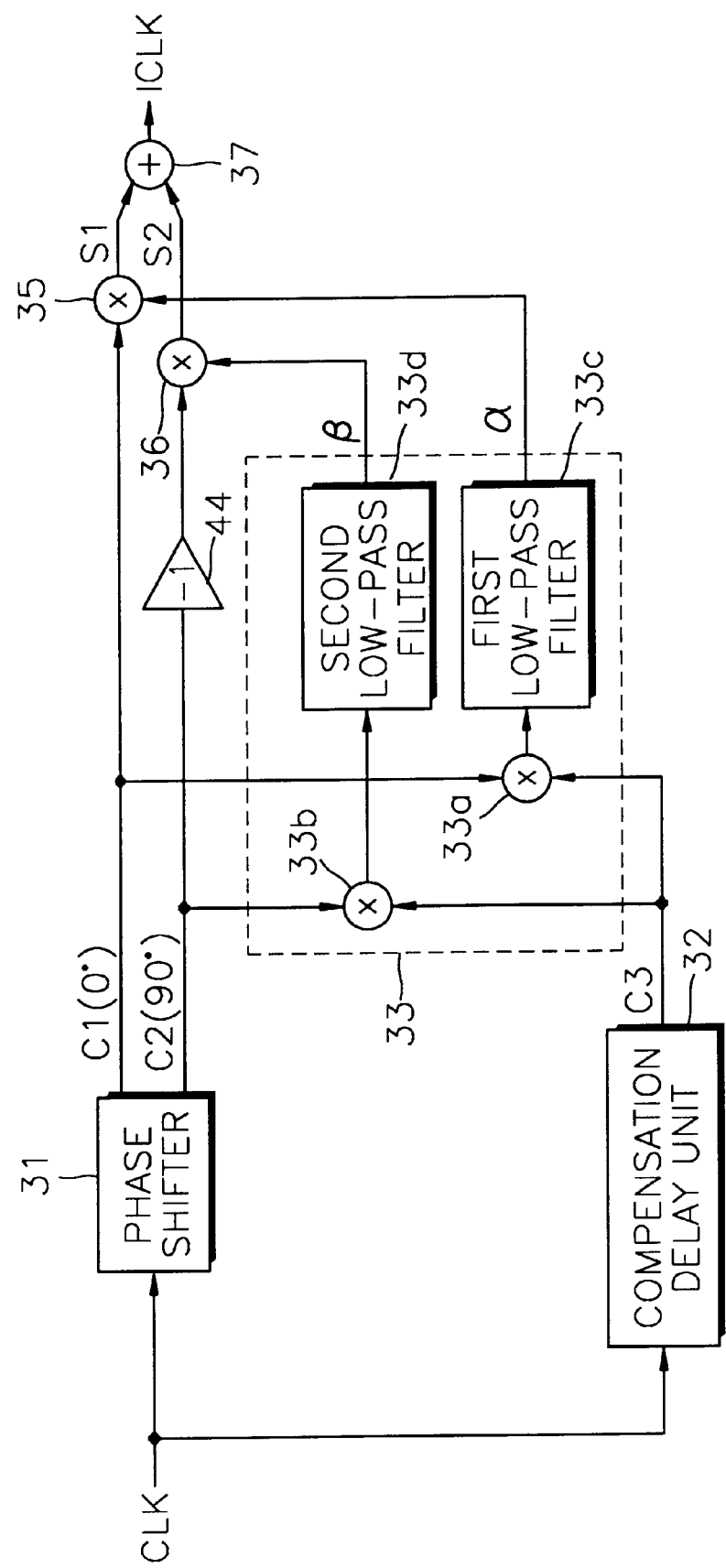
FIG. 4 is a block diagram of a delay locked loop circuit according to a second embodiment of the present invention.

FIG. 4 is a block diagram of a delay locked loop circuit according to a second embodiment of the present invention. Referring to FIG. 4, the delay locked loop circuit according to the second embodiment has functions and components substantially the same as those of the first embodiment, except that the phase inverter 44 is connected between the phase shifter 31 and the second component signal generator 36. Here, the phase inverter 44 inverts the phase of the second clock signal C2, and the second component signal generator 36 generates the second component signal S2 by multiplying the second component coefficient ($\beta$) by the second inverted clock signal ($-C2$).

Figure 5:
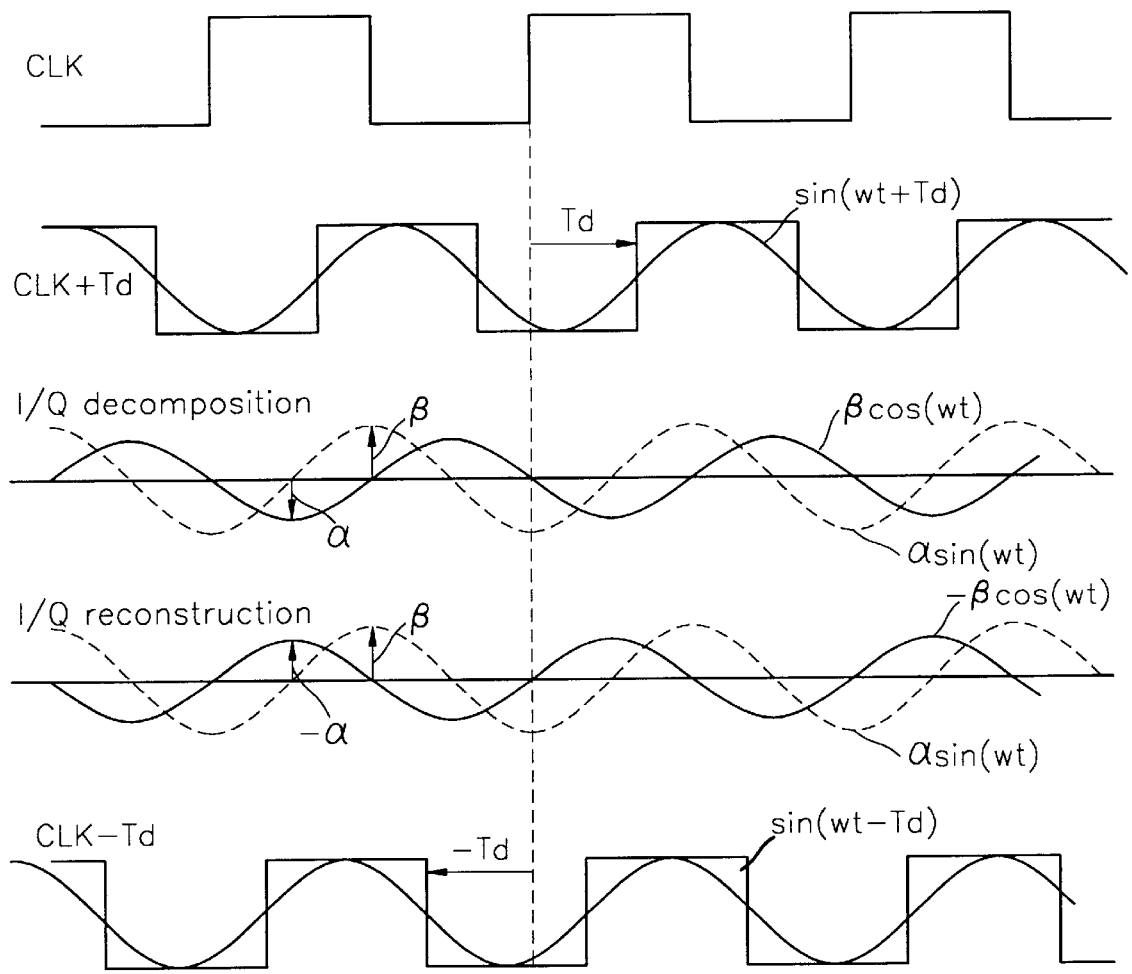
FIG. 5 is a graphical view of signal waveforms of the delay locked loop circuits shown in FIGS. 3 and 4 and their timing relationship to the clock signal according to the present invention.

FIG. 5 shows signal waveforms of the delay locked loop circuit according to the present invention shown in FIGS. 3 and 4. The operation of the delay locked loop circuit and a method of generating the output clock signal ICLK will be described with reference to FIGS. 3–5.

The delay locked loop circuit in FIGS. 3 and 4 generates the output clock signal ICLK whose phase is advanced by the delay time (Td) ahead of the input clock signal CLK to compensate for the inevitable delay time Td in a semiconductor integrated circuit. The output clock signal ICLK is denoted as "CLK–Td" in FIG. 5.

The compensation delay unit 32 of the delay locked loop circuit delays the input clock signal CLK by the delay time Td to generate a signal CLK+Td having a phase delayed by the delay time Td as the third clock signal C3. The phase shifter 31 generates the first clock signal C1 having the same phase as the phase of the input clock signal CLK, and the second clock signal C2 having a phase difference of 90° with respect to the first clock signal C1.

Here, if the input clock signal CLK is defined as SIN($\omega$t), the first and second clock signals C1 and C2 are SIN ($\omega$t) and COS ($\omega$t), respectively. The third clock signal C3 is expressed by the following Equation 1:

$$\begin{aligned} C3 &= CLK + Td \\ &= \text{SIN}(\omega t + Td) \\ &= \text{COS}(Td) * \text{SIN}(\omega t) + \text{SIN}(Td) * \text{COS}(\omega t) \end{aligned} \quad (1)$$

That is, CLK+Td is decomposed into an in-phase component SIN and a quadrature component COS. Here, COS (Td) corresponds to the first component coefficient ($\alpha$) of the third clock signal C3, and SIN (Td) corresponds to the second component coefficient ($\beta$) of the third clock signal C3. Hence, the third clock signal C3 can be expressed by the following Equation 2:

$$C3 = CLK + Td = \alpha * \text{SIN}(\omega t) + \beta * \text{COS}(\omega t) \quad (2)$$

The output clock signal ICLK to be obtained, that is, a signal (CLK–Td) whose phase is advanced by the delay time Td ahead of the input clock signal CLK, can be expressed by the following Equation 3:

$$\begin{aligned} ICLK &= CLK - Td \\ &= \text{SIN}(\omega t - Td) \\ &= \text{COS}(-Td) * \text{SIN}(\omega t) + \text{SIN}(-Td) * \text{COS}(\omega t) \\ &= \text{COS}(Td) * \text{SIN}(\omega t) - \text{SIN}(Td) * \text{COS}(\omega t) \end{aligned} \quad (3)$$

Thus, the output clock signal ICLK is expressed by the following Equation 4:

$$ICLK = CLK - Td = \alpha * \text{SIN}(\omega t) - \beta * \text{COS}(\omega t) \quad (4)$$

The first component coefficient ($\alpha$), that is, COS (Td), is obtained by multiplying CLK+Td by the in-phase component SIN(ωt) of the input clock signal CLK and low-pass filtering a result of the multiplication. In other words, the first component coefficient (α) is obtained by multiplying the first clock signal C1 by the third clock signal C3 using the first multiplier 33a shown in FIGS. 3 and 4 and low-pass filtering the result of the multiplication using the first low pass filter 33c. The product of CLK+Td by the in-phase component SIN(ωt) of the input clock signal CLK is expressed by the following Equation 5:

$$SIN(\omega t+Td)*SIN(\omega t)=[SIN(\omega t)*COS(Td)+SIN(Td)*COS(\omega t)]$$
$$SIN(\omega t)=COS(Td)*SIN^2(\omega t)+SIN(Td)*COS(\omega t)SIN(\omega t)=(1/2)*COS(Td)-(1/2)*COS(Td)*COS(2\omega t)+(1/2)*SIN(Td)*SIN(2\omega t) \quad (5)$$

According to Equation 5, a DC component COS(Td), that is, the first component coefficient (α), is obtained by low-pass filtering the result of Equation 5.

The second component coefficient (β), that is, SIN(Td), can be obtained by multiplying CLK+Td by the quadrature component COS(ωt) of the input clock signal CLK and low-pass filtering the result of the multiplication. In other words, the second component coefficient (β) is obtained by multiplying the second clock signal C2 by the third clock signal C3 using the second multiplier 33b shown in FIGS. 3 and 4 and low-pass filtering the result of the multiplication using the second low pass filter 33d. The product of CLK+Td by the quadrature component COS(ωt) of the input clock signal CLK is expressed by the following Equation 6:

$$SIN(\omega t+Td)*COS(\omega t)=[SIN(\omega t)*COS(Td)+SIN(Td)*COS(\omega t)]$$
$$COS(\omega t)=SIN(Td)*COS^2(\omega t)+COS(Td)*SIN(\omega t)COS(\omega t)=(1/2)*SIN(Td)+(1/2)*SIN(Td)*COS(2\omega t)+(1/2)*COS(Td)*SIN(2\omega t) \quad (6)$$

According to Equation 6, a DC component SIN(Td), that is, the second component coefficient (β), is obtained by low-pass filtering the result of Equation 6.

After the first and second component coefficients (α) and (β) are obtained as described above, the in-phase component SIN and the quadrature component COS of the input clock signal CLK are reconstructed according to Equation 4 to obtain the output clock signal ICLK, that is, the signal (CLK−Td), the phase of which leads that of the input clock signal CLK by the delay time Td.

Specifically, in the delay locked loop circuit in FIG. 3, the second component coefficient (β) is inverted by the phase inverter 34 to the second inverted component coefficient (−β) which is then multiplied by the second clock signal C2, that is, COS(ωt), in the second component signal generator 36, whereby to obtain the second component signal S2 (i.e., −β*COS(ωt)). The first component coefficient (α) is multiplied by the first clock signal C1, that is, SIN(ωt), in the first component signal generator 35, whereby to obtain the first component signal S1 (i.e., α*SIN(ωt)). Then, the first and second component signals S1 and S2 are mixed by the phase mixer 37, whereby to generate "α*SIN(ωt)−β*COS(ωt)" as the output clock signal ICLK. Finally, the phase of the output clock signal ICLK is advanced by the predetermined time Td ahead of the input clock signal CLK.

In the delay locked loop circuit in FIG. 4, compared with the delay locked loop circuit in FIG. 3, the second clock signal C2 is inverted by the phase inverter 44 to the second inverted clock signal (−C2).

Figure 6:
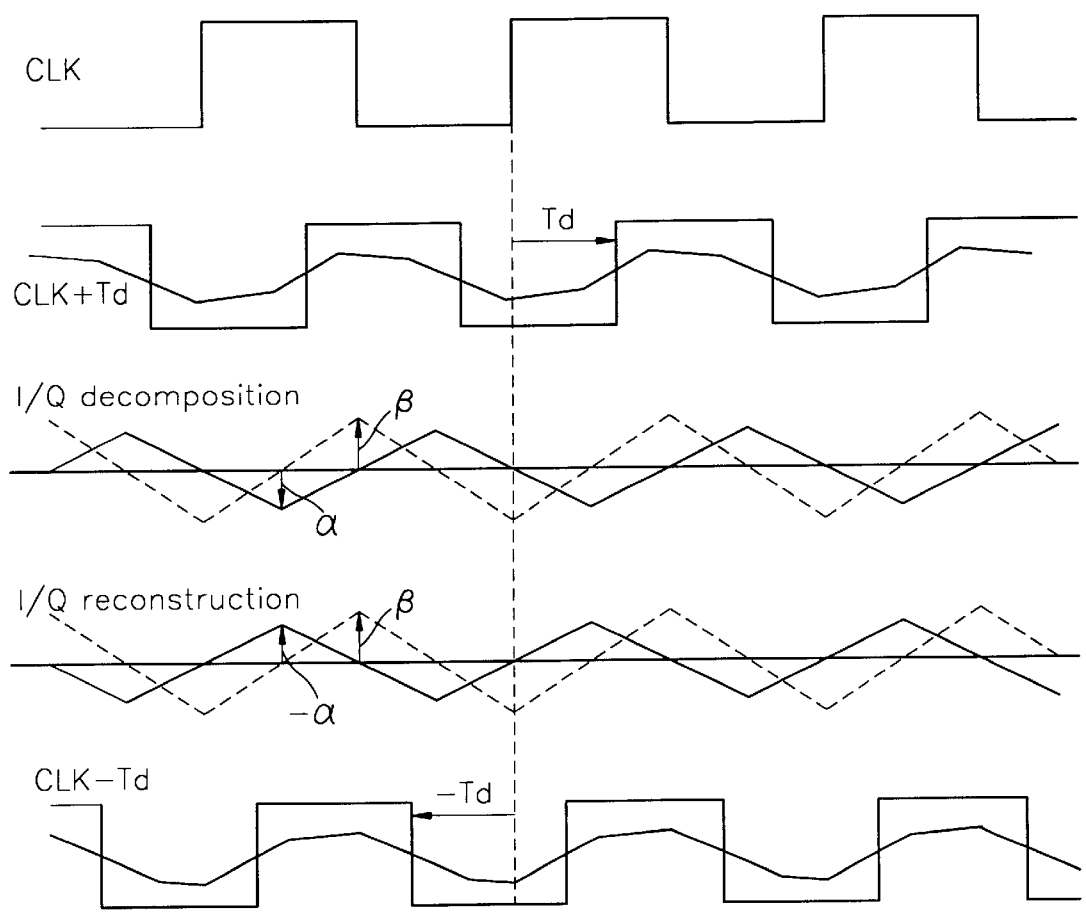
FIG. 6 shows triangular waveforms of the delay locked loop circuits shown in FIGS. 3 and 4 according to the present invention.

Referring to FIG. 6, the input clock signal CLK and the first, second and third clock signals C1, C2 and C3 have triangular waveforms. Even if the signals have such triangular waveforms, the delay locked loop circuit has the same operation as described above and generates the same output clock signal (CLK−Td). Thus, a detailed description thereof will be omitted.

The delay locked loop circuit of the present invention described above with reference to FIGS. 3 through 6 is an open loop type delay locked loop circuit, so it provides a short locking time and prevents occurrence of jitter. Also, since the delay locked loop circuit of the present invention does not include a phase detector, a charge pump and a phase selector, it has a smaller chip area and a smaller amount of power consumption than those of the conventional delay locked loop circuit shown in FIG. 2. Furthermore, the delay locked loop circuit of the present invention has no limit in operational frequency.

Figure 7:
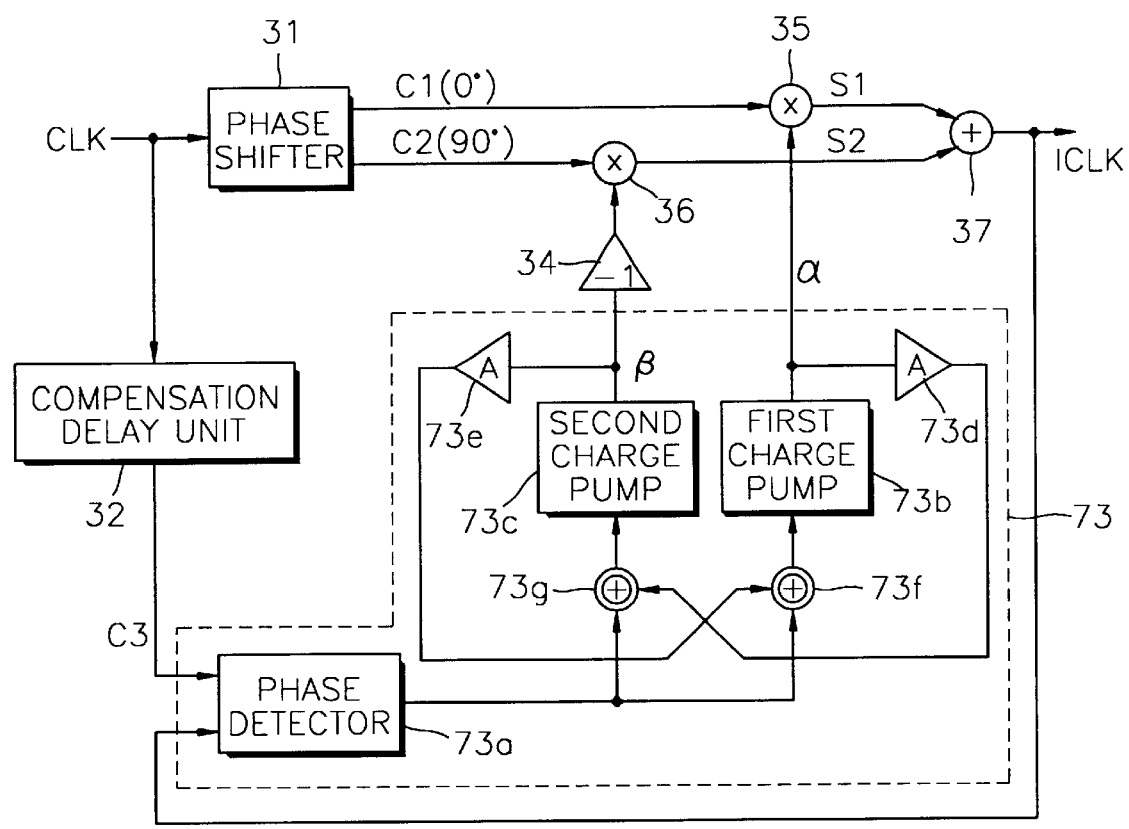
FIG. 7 is a block diagram of a delay locked loop circuit according to a third embodiment of the present invention.
Figure 8:
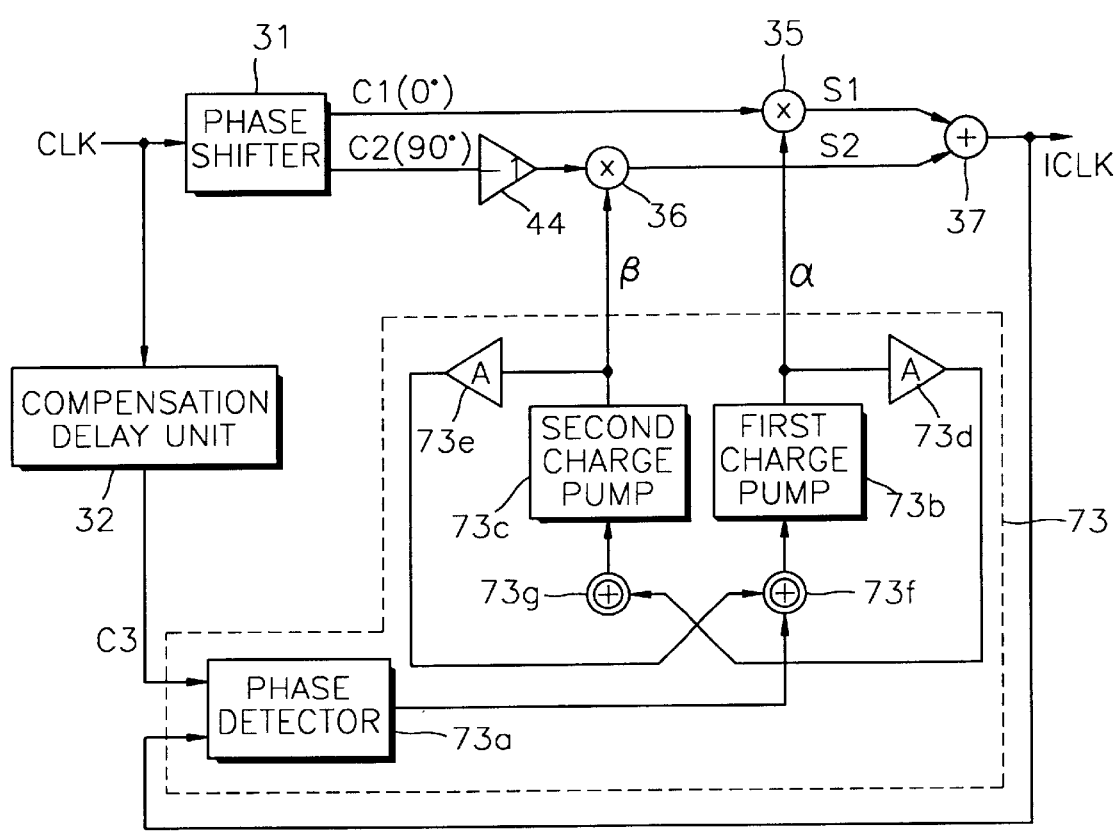
FIG. 8 is a block diagram of a delay locked loop circuit according to a fourth embodiment of the present invention.

FIG. 7 is a block diagram of a delay locked loop circuit according to a third embodiment of the present invention. The third embodiment shown in FIG. 7 is the same as the first embodiment shown in FIG. 3 except for the structure of a component coefficient extractor 73. FIG. 8 is a block diagram of a delay locked loop circuit according to a fourth embodiment of the present invention. The fourth embodiment shown in FIG. 8 is the same as the third embodiment except that a phase inverter 44 is connected between the phase shifter 31 and the second component signal generator 36. The delay locked loop circuits of the third and fourth embodiments are closed loop type delay locked loop circuits.

Referring to FIGS. 7 and 8, the component coefficient extractor 73 includes a phase detector 73a and first and second charge pumps 73b and 73c. The component coefficient extractor 73 further includes first and second voltage sensors 73d and 73e and first and second logic gates 73f and 73g (for example, exclusive OR gates) to make the first component coefficient (α) increase when the second component coefficient (β) decreases and make the first component coefficient (α) decrease when the second component coefficient (β) increases.

The phase detector 73a receives the third clock signal C3 and the output clock signal ICLK to detect the phase difference therebetween. The first voltage sensor 73d senses the voltage level of the first component coefficient (α), and the second voltage sensor 73e senses the voltage level of the second component coefficient (β). The first exclusive OR gate 73f performs exclusive OR with respect to the output signal of the phase detector 73a and the output signal of the second voltage sensor 73e, to output a signal for controlling the first charge pump 73b. The second exclusive OR gate 73g performs exclusive OR with respect to the output signal of the phase detector 73a and the output signal of the first voltage sensor 73d, to output a signal for controlling the second charge pump 73c.

The phase detector 73a, the charge pumps 73b and 73c, and the voltage sensors 73d and 73e are apparent to those skilled in the art, so they will not be described in more detail.

Figure 9:
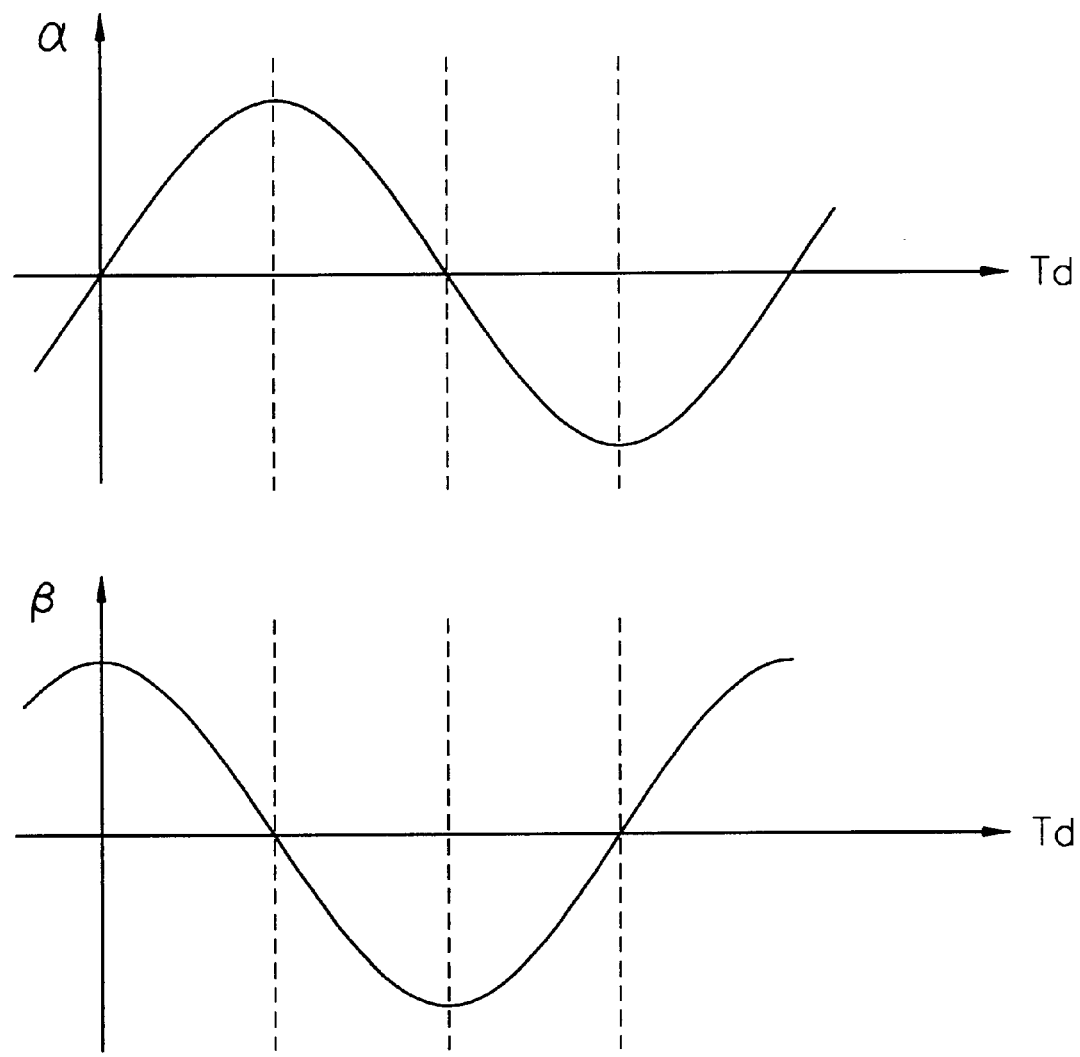
FIG. 9 shows waveforms of first and second component coefficients $\alpha$ and $\beta$ generated in a delay locked loop according to the present invention.

FIG. 9 shows waveforms of the first and second component coefficients α and β in the delay locked loop circuits in FIGS. 3 and 4. The operation of the component coefficient extractor 73 will now be described in more detail with reference to FIG. 9. As shown in FIG. 9, there is the 90° phase difference between the first and second component coefficients (α) and (β), that is, COS(Td) and SIN(Td). The first component coefficient (α) increases when the second component coefficient (β) is positive, and decreases when the second component coefficient (β) is negative. The second component coefficient (β) decreases when the first component coefficient (α) is positive, and increases when the first component coefficient (α) is negative.

Accordingly, in the third and fourth embodiments, the component coefficient extractor 73 includes first and second exclusive OR gates 73f and 73g to produce the first and second component coefficients (α) and (β) having such characteristics. That is, the first exclusive OR gate 73f inverts or non-inverts the output signal of the phase detector 73a according to the voltage level of the second component coefficient (β), and the second exclusive OR gate 73g inverts or non-inverts the output signal of the phase detector 73a according to the voltage level of the first component coefficient (α). Therefore, the first and second charge pumps 73b and 73c output the first and second component coefficients (α) and (β) which have characteristics in that the first component coefficient (α) increases when the second component coefficient (β) decreases and the first component coefficient (α) decreases when the second component coefficient (β) increases, as described above.

After the first and second component coefficients (α) and (β) are obtained by the method described above, the output clock signal (CLK–Td) having a phase leading by the delay time Td ahead of the input clock signal CLK is obtained by the same method as the method in the first and second embodiments.

Figure 2:
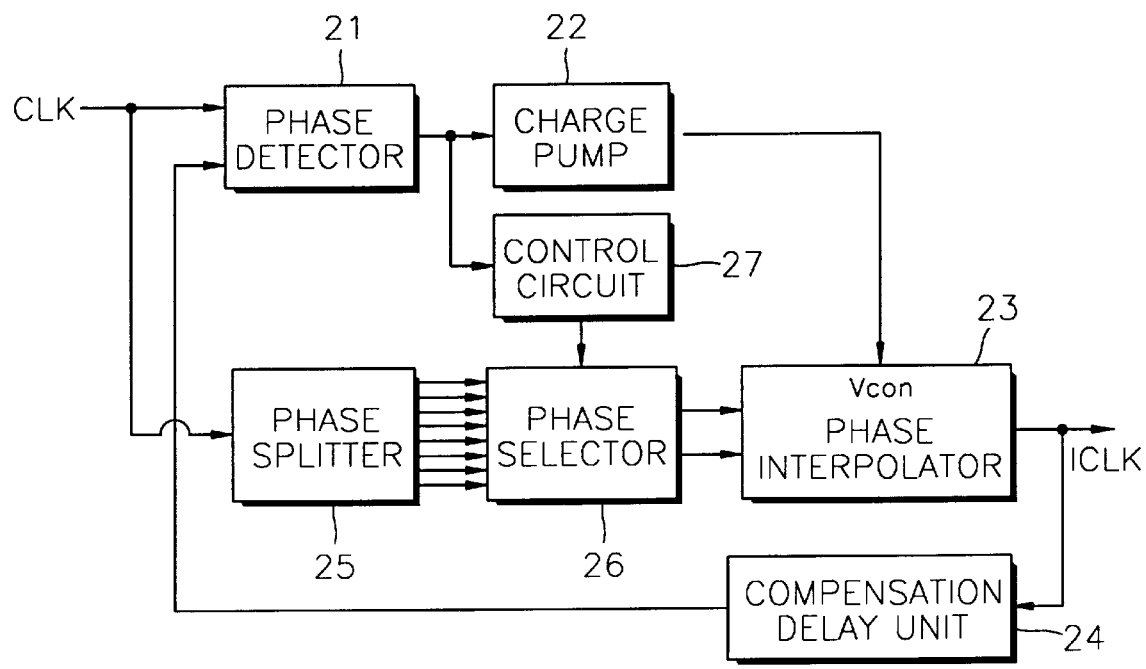
FIG. 2 is a block diagram of another conventional delay locked loop circuit using phase interpolation techniques.

The delay locked loop circuit of the present invention described above with reference to FIGS. 7–9 prevents occurrence of jitter and do not include a phase splitter, a phase selector, or the like, so that it has a small chip area and a small amount of power consumption compared to the conventional delay locked loop circuit shown in FIG. 2 when it is realized as a semiconductor integrated circuit.

Although the invention has been described with reference to a particular embodiment, it will be apparent to one of ordinary skill in the art that modifications of the described embodiment may be made without departing from the spirit and scope of the invention.

What is claimed is:

1. A delay locked loop circuit for receiving an input clock signal and generating an output clock signal, the output clock signal leading in phase the input clock signal by a predetermined time, the delay locked loop circuit comprising:
    a phase shifter for generating a first clock signal in phase with the input clock signal and a second clock signal having a 90° phase difference with respect to the first clock signal;
    a compensation delay unit for outputting a third clock signal which lags the input clock signal by the predetermined time;
    a component coefficient extractor for extracting a first component coefficient of the third clock signal with respect to the first clock signal and a second component coefficient of the third clock signal with respect to the second clock signal;
    a phase inverter for inverting the second component coefficient to produce an inverted second component coefficient;
    a first component signal generator for generating a first component signal by multiplying the first component coefficient by the first clock signal;
    a second component signal generator for generating a second component signal by multiplying the inverted second component coefficient by the second clock signal; and
    a phase mixer for mixing the first and second component signals to generate the output clock signal.

2. The delay locked loop circuit of claim 1, wherein the component coefficient extractor comprises:
    a first multiplier for multiplying the first clock signal by the third clock signal;
    a second multiplier for multiplying the second clock signal by the third clock signal;
    a first low pass filter for low-pass filtering an output signal of the first multiplier to output the first component coefficient; and
    a second low pass filter for low-pass filtering an output signal of the second multiplier to output the second component coefficient.

3. The delay locked loop circuit of claim 1, wherein the component coefficient extractor comprises:
    a phase detector for detecting a phase difference between the third clock signal and the output clock signal;
    a first charge pump for outputting the first component coefficient; and
    a second charge pump for outputting the second component coefficient,
    wherein the first component coefficient increases when the second component coefficient decreases and the first component coefficient decreases when the second component coefficient increases.

4. The delay locked loop circuit of claim 3, wherein the component coefficient extractor comprises:
    a first voltage sensor for sensing a voltage level of the first component coefficient;
    a second voltage sensor for sensing a voltage level of the second component coefficient;
    a first exclusive OR gate for performing exclusive OR with respect to an output signal of the phase detector and an output signal of the second voltage sensor to output a signal for controlling the first charge pump; and
    a second exclusive OR gate for performing exclusive OR with respect to an output signal of the phase detector and an output signal of the first voltage sensor to output a signal for controlling the second charge pump.

5. A delay locked loop circuit for receiving an input clock signal and generating an output clock signal, the output clock signal leading in phase the input clock signal by a predetermined time, the delay locked loop circuit comprising:
    a phase shifter for generating a first clock signal in phase with the input clock signal and a second clock signal having a 90° phase difference with respect to the first clock signal;
    a compensation delay unit for outputting a third clock signal which lags the input clock signal by the predetermined time;
    a component coefficient extractor for extracting a first component coefficient of the third clock signal with respect to the first clock signal and a second component coefficient of the third clock signal with respect to the second clock signal;
    a phase inverter for inverting the second clock signal to produce an inverted second clock signal;
    a first component signal generator for generating a first component signal by multiplying the first component coefficient by the first clock signal;
    a second component signal generator for generating a second component signal by multiplying the second component coefficient by the inverted second clock signal; and
    a phase mixer for mixing the first and second component signals to generate the output clock signal.

6. The delay locked loop circuit of claim 5, wherein the component coefficient extractor comprises:

a first multiplier for multiplying the first clock signal by the third clock signal;

a second multiplier for multiplying the second clock signal by the third clock signal;

a first low pass filter for low-pass filtering an output signal of the first multiplier to output the first component coefficient; and a second low pass filter for low-pass filtering an output signal of the second multiplier to output the second component coefficient.

7. The delay locked loop circuit of claim 5, wherein the component coefficient extractor comprises:

a phase detector for detecting a phase difference between the third clock signal and the output clock signal;

a first charge pump for outputting the first component coefficient; and a second charge pump for outputting the second component coefficient, wherein the first component coefficient increases when the second component coefficient decreases and the first component coefficient decreases when the second component coefficient increases.

8. The delay locked loop circuit of claim 7, wherein the component coefficient extractor comprises:

a first voltage sensor for sensing a voltage level of the first component coefficient;

a second voltage sensor for sensing a voltage level of the second component coefficient;

a first exclusive OR gate for performing exclusive OR with respect to an output signal of the phase detector and an output signal of the second voltage sensor to output a signal for controlling the first charge pump; and a second exclusive OR gate for performing exclusive OR with respect to an output signal of the phase detector and an output signal of the first voltage sensor to output a signal for controlling the second charge pump.

9. A delay locked loop circuit for receiving an input clock signal and for generating an output clock signal whose phase leads the input clock signal by a predetermined time period, the delay locked loop circuit comprising:

a phase shifter for shifting the input clock signal to generate an in-phase component signal of the input clock signal and a quadrature component signal of the input clock signal;

a delay unit for delaying the input clock signal by the predetermined time period to generate a delayed clock signal;

a decomposer for decomposing the delayed clock signal into an in-phase component and a quadrature component using the in-phase component signal and the quadrature component signal, and for generating an in-phase component coefficient and a quadrature component coefficient; and a composer for composing the output clock signal with the in-phase component signal, the quadrature component signal, the in-phase component coefficient, and the quadrature component coefficient.

10. The delay locked loop circuit of claim 9, wherein the decomposer includes:

a first multiplier for multiplying the in-phase component signal and the delayed clock signal;

a second multiplier for multiplying the quadrature component signal and the delayed clock signal;

a first filter for filtering an output of the first multiplier to generate the in-phase component coefficient; and a second filter for filtering an output of the second multiplier to generate the quadrature component coefficient.

11. The delay locked loop circuit of claim 9, wherein the composer includes:

a third multiplier for multiplying the in-phase component signal and the in-phase component coefficient;

a fourth multiplier for multiplying the quadrature component signal and the quadrature component coefficient, wherein one of the quadrature component signal and the quadrature component coefficient is previously inverted;

a mixer for mixing an output of the third multiplier and an output of the fourth multiplier to generate the output clock signal.

12. The delay locked loop circuit of claim 9, wherein the decomposer includes:

a phase detector for detecting a phase difference between the delayed clock signal and the output clock signal;

a first control unit receiving the phase difference, for varying the in-phase component coefficient such that the in-phase component coefficient increases when the quadrature component coefficient is positive and the in-phase component coefficient decreases when the quadrature component coefficient is negative; and a second control unit receiving the phase difference, for varying the quadrature component coefficient such that the quadrature component coefficient increases when the in-phase component coefficient is negative and the quadrature component coefficient decreases when the in-phase component coefficient is positive.

13. The delay locked loop circuit of claim 12, wherein the first control unit includes:

a first voltage sensor for sensing a voltage level of the in-phase component coefficient;

a first inverter for inverting the phase difference provided from the phase detector in response to an output of the first voltage sensor; and a first charge pump for varying the in-phase component coefficient in response to an output of the first inverter.

14. The delay locked loop circuit of claim 12, wherein the second control unit includes:

a second voltage sensor for sensing a voltage level of the quadrature component coefficient;

a second inverter for inverting the phase difference provided from the phase detector in response to an output of the second voltage sensor; and a second charge pump for varying the quadrature component coefficient in response to an output of the second inverter.

15. A method of generating an output clock signal which leads in phase an input clock signal by a predetermined time, the method comprising the steps of:

generating a first clock signal in phase with the input clock signal and a second clock signal having a 90° phase difference with respect to the first clock signal;

generating a third clock signal which lags the input clock signal by the predetermined time;

extracting a first component coefficient of the third clock signal with respect to the first clock signal and a second component coefficient of the third clock signal with respect to the second clock signal;

multiplying the first component coefficient by the first clock signal;

multiplying the second component coefficient by the second clock signal; and mixing signals obtained from the steps of multiplying the first component coefficient and multiplying the second component coefficient to generate the output clock signal.

16. The method of claim 15, wherein the step of extracting comprises the steps of:

multiplying the first clock signal by the third clock signal;

multiplying the second clock signal by the third clock signal;

low-pass filtering a signal obtained from the step of multiplying the first clock signal by the third clock signal to generate the first component coefficient; and low-pass filtering a signal obtained from the step of multiplying the second clock signal by the third clock signal to generate the second component coefficient.

17. The method of claim 15, wherein the step of extracting comprises the steps of:

detecting a phase difference between the third clock signal and the output clock signal to generate a control signal corresponding to the phase difference;

outputting the first component coefficient by charge-pumping a first signal which is controlled by the control signal and the second component coefficient; and outputting the second component coefficient by charge-pumping a second signal which is controlled by the control signal and the first component coefficient, wherein the first component coefficient increases when the second component coefficient decreases and the first component coefficient decreases when the second component coefficient increases.

18. The method of claim 17, wherein the step of extracting comprises the steps of:

sensing a voltage level of the first component coefficient to generate a first sensing signal;

sensing a voltage level of the second component coefficient to generate a second sensing signal;

performing exclusive OR with respect to the control signal and the second sensing signal to generate the first signal; and performing exclusive OR with respect to the control signal and the first sensing signal to generate the second signal.

19. The method of claim 15, wherein the step of generating the second clock signal includes the steps of:

shifting phase of the input clock signal to generate a phase-shifted clock signal; and inverting phase of the phase-shifted clock signal to generate the second clock signal.

20. The method of claim 15, wherein the step of extracting includes the steps of:

detecting a quadrature component coefficient of the third clock signal; and inverting phase of the quadrature component coefficient to generate the second component coefficient.

* * * * *